United States Patent
Lei et al.

(10) Patent No.: US 8,927,393 B1
(45) Date of Patent: Jan. 6, 2015

(54) WATER SOLUBLE MASK FORMATION BY DRY FILM VACUUM LAMINATION FOR LASER AND PLASMA DICING

(71) Applicants: Wei-Sheng Lei, San Jose, CA (US); James S. Papanu, San Rafael, CA (US); Prabhat Kumar, Fremont, CA (US); Brad Eaton, Menlo Park, CA (US); Ajay Kumar, Cupertino, CA (US)

(72) Inventors: Wei-Sheng Lei, San Jose, CA (US); James S. Papanu, San Rafael, CA (US); Prabhat Kumar, Fremont, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/167,548

(22) Filed: Jan. 29, 2014

(51) Int. Cl.
*H01L 21/3065* (2006.01)
*H01L 21/82* (2006.01)
*H01L 21/67* (2006.01)

(52) U.S. Cl.
CPC .......... *H01L 21/82* (2013.01); *H01L 21/67069* (2013.01)
USPC .................................. 438/462; 257/E21.602

(58) Field of Classification Search
CPC ..................... H01L 21/3065; H01L 21/67207; H01L 21/78
USPC .................................. 438/462; 257/E21.602
See application file for complete search history.

(56) References Cited

U.S. PATENT DOCUMENTS

| | | | |
|---|---|---|---|
| 4,049,944 A | 9/1977 | Garvin et al. | |
| 5,593,606 A | 1/1997 | Owen et al. | |
| 6,057,180 A | 5/2000 | Sun et al. | |
| 6,174,271 B1 | 1/2001 | Kosmowski | |
| 6,306,731 B1 | 10/2001 | Igarashi et al. | |
| 6,407,363 B2 | 6/2002 | Dunsky et al. | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1 No. 7, 7 pgs.

(Continued)

*Primary Examiner* — John C Ingham
(74) *Attorney, Agent, or Firm* — Blakely Sokoloff Taylor Zafman LLP

(57) ABSTRACT

Methods and systems for dicing a semiconductor wafer including a plurality of integrated circuits (ICs) are described. In one embodiment, a method involves adhering an adhesive tape to a thin water soluble dry film. The method involves applying the thin water soluble dry film adhered to the adhesive tape over a surface of the semiconductor wafer. The method involves removing the adhesive tape from the thin water soluble dry film. The thin water soluble dry film is patterned with a laser scribing process, exposing regions of the semiconductor wafer between the ICs. The method involves etching the semiconductor wafer through gaps in the patterned thin water soluble dry film, and removing the thin water soluble dry film.

6 Claims, 13 Drawing Sheets

(56) References Cited

U.S. PATENT DOCUMENTS

| | | | |
|---|---|---|---|
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,639 B2 | 3/2009 | Nakamura |
| 7,629,228 B2 | 12/2009 | Haji et al. |
| 7,678,611 B2 * | 3/2010 | Park | 438/114 |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,927,973 B2 | 4/2011 | Haji et al. |
| 2003/0162313 A1 | 8/2003 | Kim et al. |
| 2004/0080045 A1 | 4/2004 | Kimura et al. |
| 2004/0137700 A1 | 7/2004 | Sekiya |
| 2006/0043535 A1 | 3/2006 | Hiatt |
| 2006/0205182 A1 | 9/2006 | Soejima |
| 2009/0255911 A1 | 10/2009 | Krishnaswami et al. |
| 2011/0312157 A1 | 12/2011 | Lei et al. |
| 2012/0322234 A1 * | 12/2012 | Yalamanchili et al. | 438/462 |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet at al., "Apparatus and Methods for Dry Etch With Edge, Side and Back Protection", U.S. Appl. No. 61/491,693, filed May 31, 2011 24 pgs.

* cited by examiner

WATER SOLUBLE MASK FORMATION BY DRY FILM VACUUM LAMINATION FOR LASER AND PLASMA DICING

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice or dies.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dies. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dies. In addition, cracks can form and propagate from the edges of the dies into the substrate and render the integrated circuit inoperative. Chipping and cracking are particularly a problem with scribing because only one side of a square or rectangular die can be scribed in the direction of the crystalline structure. Consequently, cleaving of the other side of the die results in a jagged separation line. Because of chipping and cracking, additional spacing is typically required between the dies on the wafer to prevent damage to the integrated circuits, e.g., the chips and cracks are maintained at a distance from the actual integrated circuits. As a result of the spacing requirements, not as many dies can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits; three to five hundred microns often must separate the circuitry of each of the dies. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

One or more embodiments of the invention are directed to methods of dicing semiconductor wafers, each wafer having a plurality of integrated circuits thereon.

According to one embodiment, a method of dicing a semiconductor wafer involves adhering an adhesive tape to a thin water soluble dry film. The method involves applying the thin water soluble dry film adhered to the adhesive tape over a surface of the semiconductor wafer. The method involves removing the adhesive tape from the thin water soluble dry film. The method involves patterning the thin water soluble dry film with a laser scribing process, exposing regions of the semiconductor wafer between the ICs. The method involves etching the semiconductor wafer through gaps in the patterned thin water soluble dry film. The method also involves removing the thin water soluble dry film.

According to another embodiment, a method of dicing a substrate involves adhering an adhesive tape to a thin dry film. The method involves laminating the thin dry film adhered to the adhesive tape over the substrate. The method involves releasing the adhesive tape from the thin dry film. The method involves patterning, with a laser scribe process, the thin dry film to form a trench exposing regions of the substrate between the ICs. The method involves etching the substrate to advance the trench through the substrate. The method involves removing the thin dry film from the substrate.

In one embodiment, a system for dicing a substrate includes a tape applicator configured to adhere an adhesive tape to a thin dry film. The system includes a dry lamination module configured to laminate the thin dry film adhered to the adhesive tape over the substrate. The system includes a curing module to release the adhesive tape from the thin dry film. The system includes a laser scribe module configured to pattern, with a laser scribe process, the thin dry film to form a trench exposing regions of the substrate between the ICs. The system also includes a plasma etch module physically coupled to the laser scribe module and configured to etch the substrate to advance the trench through the substrate.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Figure 1A:
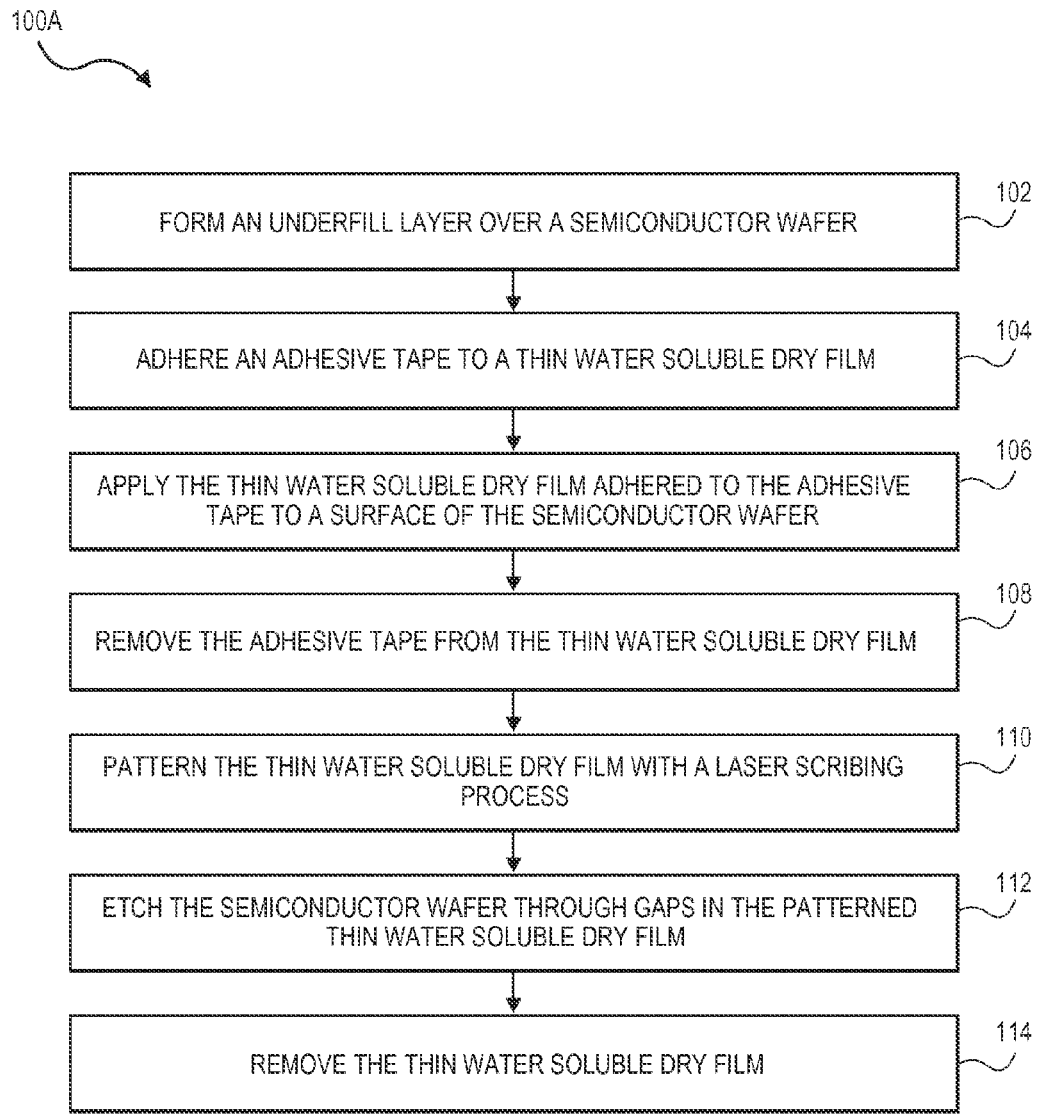
FIGS. 1A and 1B are flowcharts representing operations in methods of dicing a semiconductor wafer including a plurality of integrated circuits, in accordance with embodiments of the present invention.

Methods of dicing semiconductor wafers, each wafer having a plurality of integrated circuits thereon, are described. In the following description, numerous specific details are set forth, such as laser and plasma etch wafer dicing approaches with masks including water soluble dry films, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

When dicing wafers that are 300 μm or thicker, the wafers are rigid enough to be directly placed on mounting tapes without die attach film (DAF). In circumstances where wafers are placed on mounting tapes without DAF, no DAF cutting process is involved. Embodiments described herein address the dicing applications of integrated circuit (IC) wafers (e.g., integrated wafers with processor chips) that have a thickness of 250 μm to 800 μm. Furthermore, embodiments address dicing applications of integrated circuit wafers with an acceptable dicing kerf width of 50 μm to 200 μm width, preferably 50 μm to 100 μm measured on the wafer front surface. A kerf width of 50 μm to 100 μm measured on the wafer front surface corresponds to a typical kerf width measured from the back side of the wafer of 30-50 μm in a laser/saw hybrid process.

In embodiments, a hybrid wafer or substrate dicing process involving an initial laser scribe and subsequent plasma etch is implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. Thus, in one embodiment, a method uses a hybrid approach employing laser scribing and plasma etching to dice the wafers. The laser scribing removes difficult-to-etch passivation layers, dielectric layers, and metal layers until the underlying silicon substrate is exposed. Plasma etching generates trenches of a depth to the target die thickness. In another embodiment, the laser etch process may involve ablating, with the laser scribing process, the entire thickness of the substrate, followed by plasma etching the substrate surfaces exposed by the laser scribing process. In one such embodiment, the plasma etching may remove semiconductor damaged by the laser ablation to improve die strength.

Thus, according to embodiments, the proposed approaches use both laser scribing and plasma etching instead of only laser scribing or blade sawing to generate trenches in a semiconductor wafer. Embodiments involve forming a water soluble mask layer over the semiconductor wafer to protect the integrated circuits (and in some embodiments, to protect bumps or pads) from being exposed during laser scribing and/or plasma etching. Conventionally, such a mask layer could be formed by techniques such as spin-coating or screen printing. However, such methods may result in voids or air bubbles due to the high viscosity of the mask material, which may result in a defective mask that fails to provide sufficient protection from the plasma etching.

Other conventional methods of forming a mask involve applying a UV-curable resin sheet directly onto the wafer surface. After plasma processing, the mask is then cured and a tape is attached to the UV-cured mask to remove the UV-cured mask from the wafer. However, such methods are disadvantageous because the UV-curable mask material may be difficult to remove from the wafer surface after processing (e.g., after processing with a laser and/or plasma). Additionally, if such a UV-curable mask is applied to an underlying polymeric material such as a dry film underfill layer, laser processing may result in melting and re-solidifying of the two layers at the kerf edge, making the layers difficult to separate.

According to embodiments of the invention, a water soluble film is formed over the wafer surface with a dry lamination technique. The water soluble film protects the integrated circuits from laser and/or plasma processing. In contrast to existing techniques that involve spin-coating and screen-printing, embodiments enable water soluble film formation with minimal air bubble or void formation.

In one such embodiment, a water soluble film to be formed over the wafer is thin. For example, in one embodiment, the water soluble film has a thickness of 5 to 15 μm (e.g., where approximately 5 to 10 μm of a bump or pad top is exposed above an underfill layer for soldering). Existing dry lamination techniques are impractical for application of thin water soluble films. Dry lamination techniques generally involve heating the film to be applied to a predetermined temperature to soften the film. The film is then stretched (e.g., in a vacuum) and laminated onto a surface. Such dry lamination techniques may only be effective for dry films that are thick enough to sustain the stretching stress to avoid breakage. For example, dry lamination techniques typically require a minimum film thickness of 25 μm to achieve reasonable throughput.

According to embodiments, the thin water soluble dry film is adhered to an adhesive tape that is releasable by thermal or UV curing. The compound tape (including the water soluble dry film and the adhesive tape) is then attached onto the wafer surface via vacuum lamination, and the adhesive tape is released. After attaching the thin water soluble dry film, the method may involve laser and plasma processing to dice the wafer. Such embodiments may enable application of thin water soluble dry films via dry lamination without breakage of the thin water soluble film.

Figure 1B:
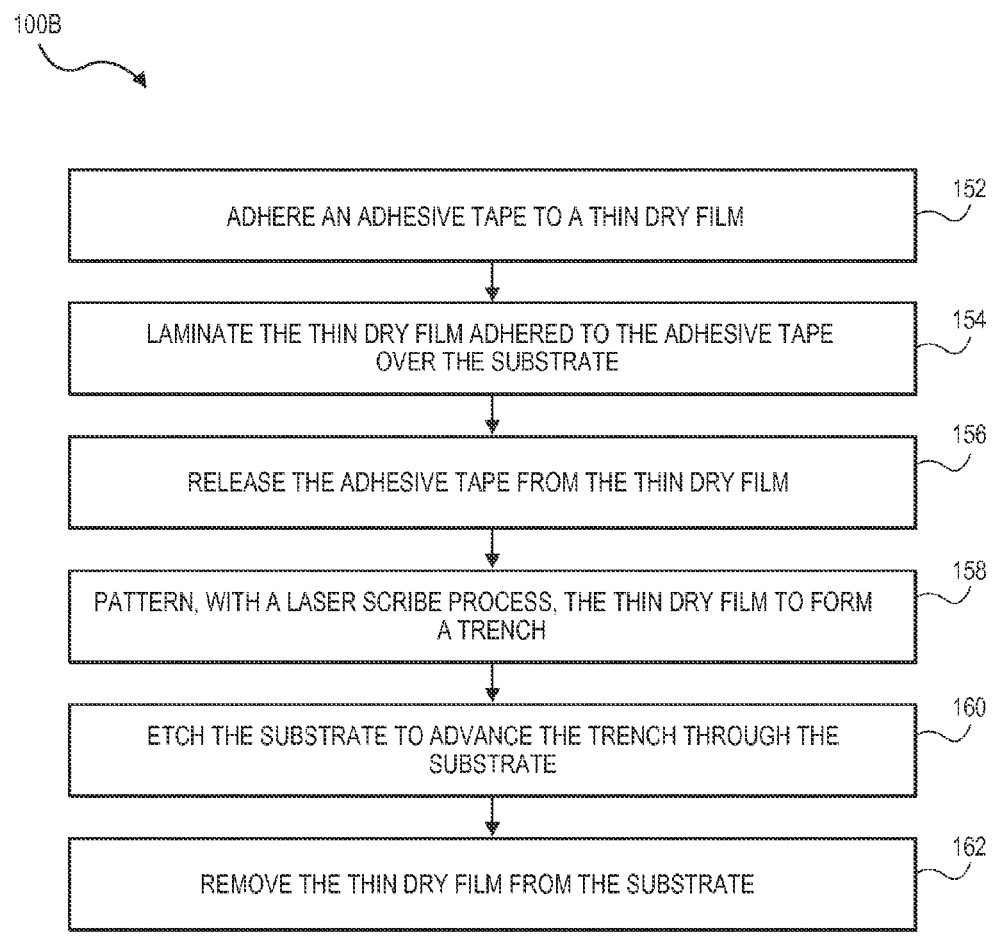

Further details are described below with respect to the exemplary methods in FIGS. 1A, 1B, and 3. FIGS. 1A and 1B are flowcharts representing operations in methods of dicing a semiconductor wafer including a plurality of integrated circuits, in accordance with embodiments of the present invention. FIGS. 2A, 2B, 2C, 2D, 2E, 2F, 2G, and 2H illustrate cross-sectional views of a semiconductor wafer including a plurality of integrated circuits during performance of a method of dicing the semiconductor wafer, corresponding to operations of FIGS. 1A and 1B, in accordance with embodiments of the present invention.

Figure 2A:
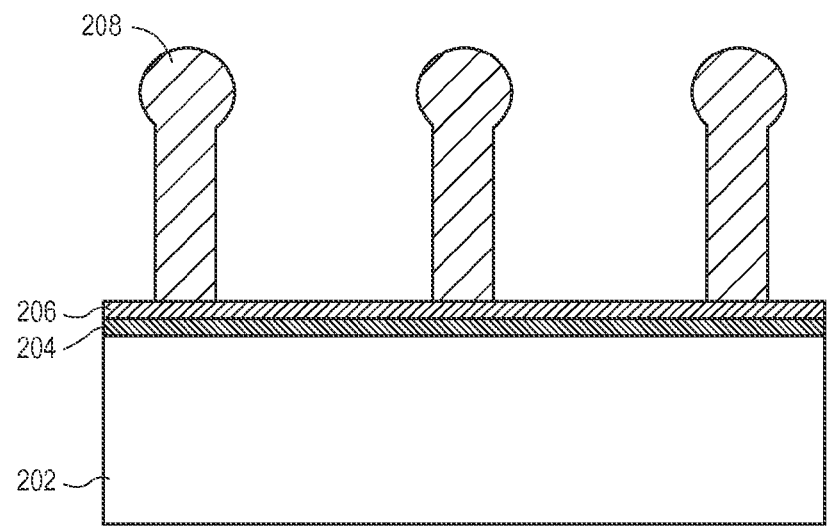
FIGS. 2A, 2B, 2C, 2D, 2E, 2F, 2G, and 2H illustrate cross-sectional views of a semiconductor wafer including a plurality of integrated circuits during performance of a method of dicing the semiconductor wafer, corresponding to operations of FIGS. 1A and 1B, in accordance with embodiments of the present invention.
Figure 5:
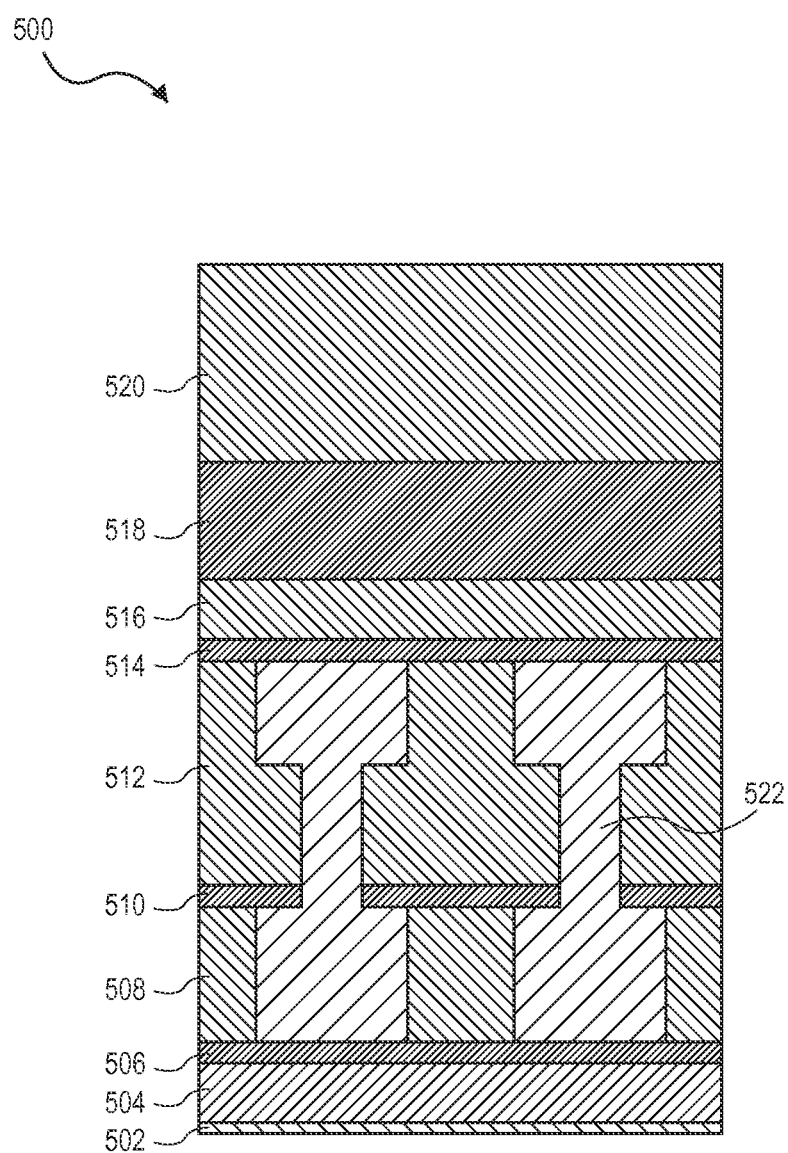
FIG. 5 illustrates a cross-sectional view of a stack of materials that may be present in a street region of a semiconductor wafer or substrate, in accordance with embodiments of the present invention.

The methods 100A of FIG. 1A and 100B of FIG. 1B begin with a semiconductor wafer or substrate with a plurality of integrated circuits (ICs). FIG. 2A illustrates a cross-sectional view of an exemplary semiconductor wafer. According to one embodiment, the semiconductor wafer or substrate 202 has a diameter of at least 300 mm and has a thickness of 250 µm to 800 µm. The semiconductor wafer or substrate 202 has disposed thereon or therein, as a portion of the integrated circuits 204, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. Conductive bumps or pads 208 and passivation layers 206 may be formed above the interconnect layers. The conductive bumps or pads 208 may include solder balls. According to some embodiments, the conductive bumps or pads 208 are approximately 50 µm or taller. However, the embodiments described herein may also be used for dicing integrated circuits with conductive bumps or pads that are shorter than 50 µm. Materials making up the streets may be similar to or the same as those materials used to form the integrated circuits. For example, streets may be composed of layers of dielectric materials, semiconductor materials, and metallization. In one embodiment, one or more of the streets includes test devices similar to the actual devices of the integrated circuits. FIG. 5 and the corresponding description below describes the streets in further detail.

Figure 2B:
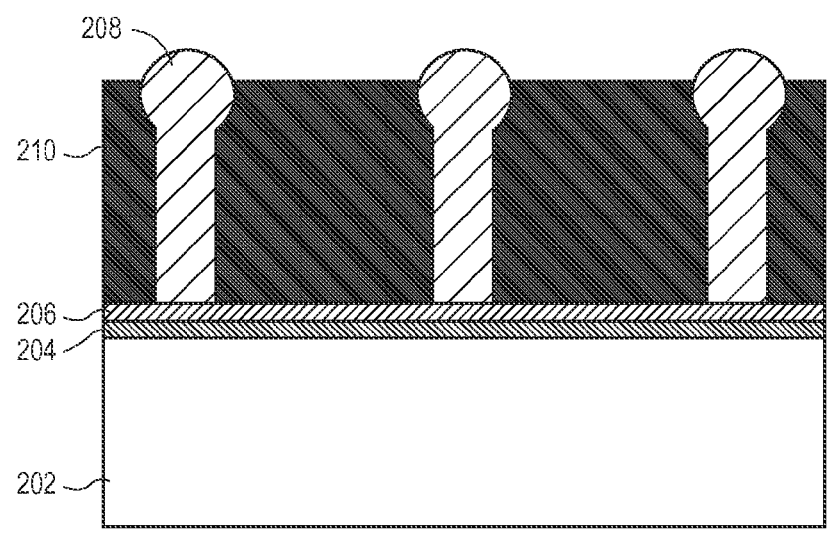

Turning to FIG. 1A and to corresponding FIG. 2B, in one embodiment, the method includes forming an underfill layer 210 over the semiconductor wafer or substrate 202, at operation 102. The underfill layer 210 partially covers the bumps or pads 208 disposed over the semiconductor wafer or substrate 202. For example, in one embodiment, 5-10 µm of the bumps or pads 208 are exposed above the underfill layer 210. The embodiment illustrated in FIG. 2B is an example of a wafer-level underfill technique in which the underfill layer 210 is formed over the semiconductor wafer or substrate 202 prior to dicing, in contrast to conventional post-dicing underfill application. In conventional post-dicing underfill application, a liquid underfill capillary wetting and curing approach is typically used to form a solid underfill layer between dies. However, such a method may result in packaging yield loss and stacked die reliability issues, especially as the number of stacked dies increases for three-dimensional (3D) semiconductor die packaging applications.

According to embodiments, the underfill layer 210 may be a dry underfill film that is formed over the semiconductor wafer or substrate 202 with a dry lamination process, followed by wafer dicing as described below to singulate the dies. Each of the singulated dies would bear a dry underfill film over it, eliminating the need for post-dicing underfill application, and therefore preventing the packaging yield loss and reliability issues associated with some post-dicing underfill techniques. The dies can then be stacked to form 3D packages. In one embodiment, the dry underfill film is thermally conductive, electrically insulating, and provides mechanical support to each die. Thus, in embodiments, the underfill layer 210 enables more rigid dies and reduces the risk of die warpage.

Figure 2C:
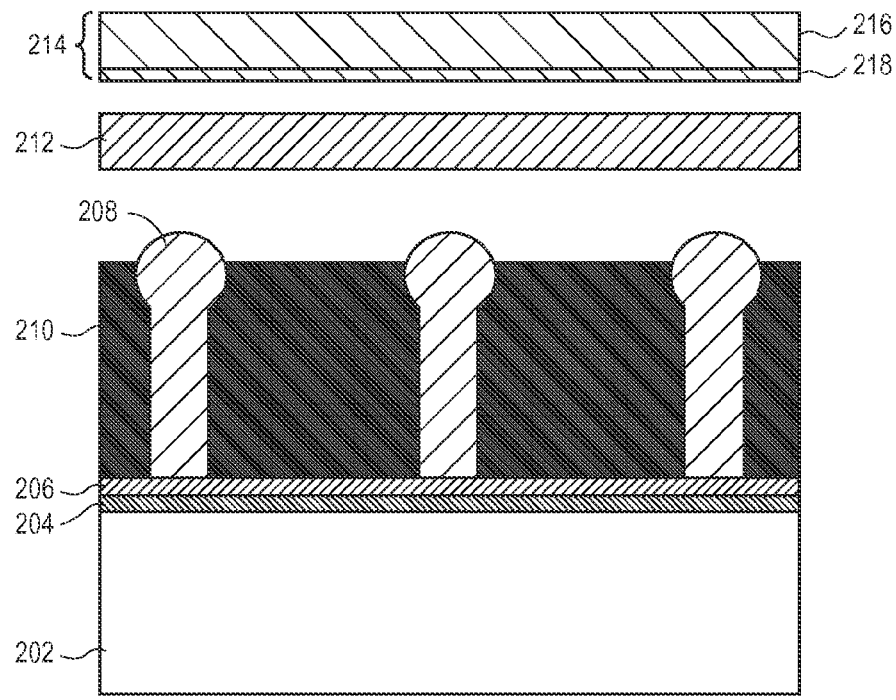

Returning to FIG. 1A and to corresponding FIG. 2C, the method 100A includes adhering an adhesive tape 214 to a thin water soluble dry film 212 at operation 104. Similarly, the method 100B of FIG. 1B involves adhering an adhesive tape 214 to a thin water soluble dry film 212 at operation 152. In one embodiment, the thin water soluble dry film 212 is to be of sufficient thickness to survive the subsequent plasma etch process, protecting even the bumps or pads 208 which, typically being copper, may be damaged, oxidized, or otherwise contaminated if exposed to an etchant plasma. In another embodiment, the bumps or pads 208 may be exposed during plasma etching. The minimum thickness of the water soluble dry film 212 is a function of the selectivity achieved by the subsequent plasma etch (e.g., operation 112 in FIG. 1A and operation 160 of FIG. 1B). The plasma etch selectivity is dependent on at least both the material/composition of the water soluble layer and the etch process employed. Generally, where the plasma utilized has relatively low ion bombardment energy, etch selectivity over the mask material is improved, allowing for a thinner water soluble dry film. In one embodiment, the thin water soluble dry film has a thickness in a range of 5 to 15 µm.

In an embodiment, the water soluble dry film 212 includes a water soluble polymer. Many such polymers are commercially available for applications such as laundry and shopping bags, green packaging, etc. However, selection of water soluble material for the present invention is complicated by stringent demands on maximum film thickness, etch resistance, thermal stability, mechanics of applying and removing the material from the substrate, and microcontamination. Exemplary materials include, at least one of: poly(vinyl alcohol) (PVA), poly(acrylic acid), poly(methacrylic acid), poly(acrylamide), or poly(ethylene oxide) with many other water soluble materials also available.

The adhesive tape 214 may be a dicing tape or other adhesive tape. In the illustrated embodiment, the adhesive tape 214 includes a base material layer 216 and a release layer 218 with an adhesive coating. Adhering an adhesive tape to the thin water soluble dry film may involve adhering the release layer of the adhesive tape to one side of the thin water soluble dry film with the adhesive coating. The base material 216 may include, for example, polyvinyl chloride (PVC). The release film 218 may include, for example, polyester. According to embodiments, the adhesive coating is UV curable, thermally curable, or another type of curable film to enable release of the adhesive tape 214. The adhesive coating may be, for example, acrylic. In one embodiment, the base material 216 has a thickness in a range of 50 to 90 µm, the adhesive coating has a thickness in a range of 5 to 15 µm, and the release film has a thickness in the range of 20 to 40 µm.

Figure 2D:
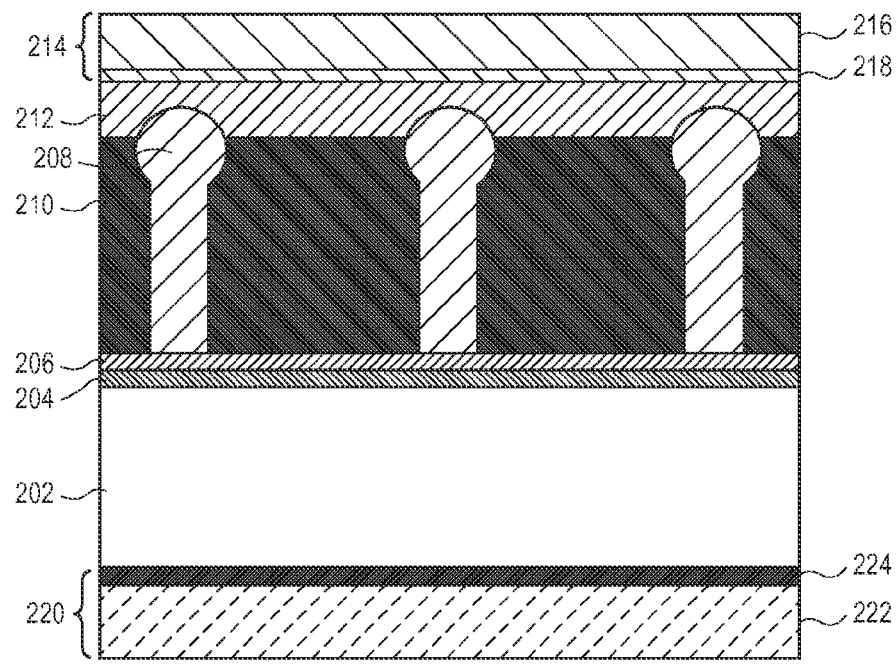

After adhering the adhesive tape 214 to the thin water soluble dry film 212, the method 100A involves applying the thin water soluble dry film adhered to the adhesive tape over a surface of the semiconductor wafer or substrate 202 at operation 106, and corresponding to FIG. 2D. Applying the thin water soluble dry film 212 may involve attaching a second side of the thin water soluble dry film (i.e., the side that is opposite to the side adhered to the adhesive tape 214) to the surface of the semiconductor wafer. In the illustrated embodiment, applying the thin water soluble dry film adhered to the adhesive tape forms a mask that covers and protects integrated circuits (ICs) formed over the surface of semiconductor wafer and also protects the bumps or pads 208 projecting or protruding up from the surface of the semiconductor wafer. The water soluble dry film 212 also covers intervening streets formed between adjacent ones of the integrated circuits.

Applying the thin water soluble dry film to the surface of the semiconductor wafer may involve heating the thin water soluble dry film adhered to the adhesive tape, stretching the heated thin water soluble dry film adhered to the adhesive tape, and attaching the stretched thin water soluble dry film adhered to the adhesive tape to the surface of the semiconductor wafer. Methods that include heating the thin water soluble dry film may involve indirectly heating the film by heating the wafer chuck over which the semiconductor wafer or substrate is disposed. For example, in one embodiment, the wafer chuck is heated in a vacuum chamber to a predetermined temperature (e.g., <90° C.). Embodiments involving heating of the dry film may improve the quality of the applied film. Other embodiments may not involve heating the thin water soluble dry film. Similar to the method 100A, the method 100B of FIG. 1B involves laminating the thin dry film adhered to the adhesive tape over the substrate at operation 154. The use of the adhesive tape 214 enables application of thinner water soluble films than would otherwise be possible with application methods involving heating and/or stretching of the film to be applied. The methods 100A and 100B may also include attaching the semiconductor wafer or substrate to dicing tape 220, which is attached to a tape frame (not shown) for subsequent dicing operations. The dicing tape 220 may include, for example, a base material 222 and a release layer 224.

Figure 2E:
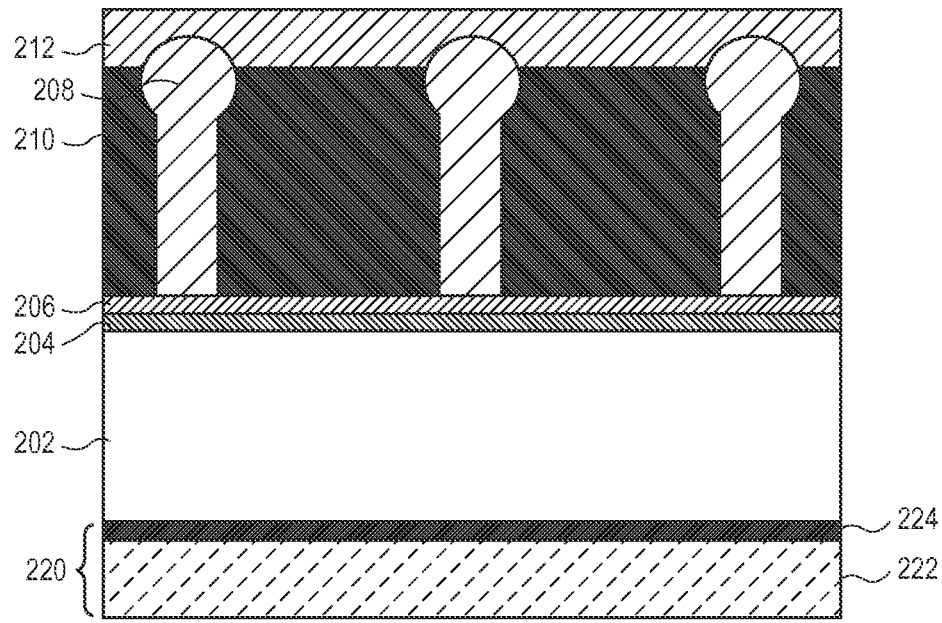

At operation 108, which corresponds to FIG. 2E, the method 100A involves removing the adhesive tape 214 from the thin water soluble dry film 212. Removing the adhesive tape 214 may involve releasing the release layer 218. Releasing the release layer 218 may involve, for example, irradiating the adhesive tape 214 with UV radiation, or heating the adhesive tape 214. Similarly, the method 100B of FIG. 1B involves releasing the adhesive tape from the thin dry film at operation 156.

Figure 2F:
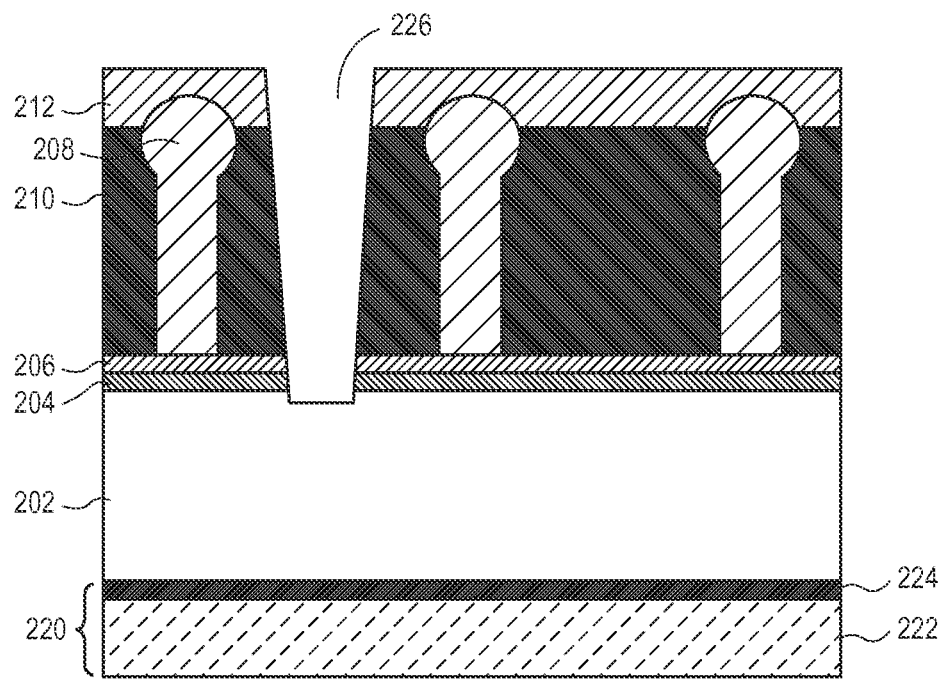

The methods 100A and 100B involve dicing the semiconductor wafer or substrate 202 with a hybrid laser plasma method. In one such embodiment, the method 100A involves patterning the thin water soluble dry film with a laser scribing process at operation 110, as illustrated in FIG. 2F. The laser scribing process exposes regions 226 (e.g., gaps or trenches) of the semiconductor wafer between the ICs. The method 100B similarly involves patterning, with a laser scribe process, the thin dry film to form a trench at operation 158. To minimize dielectric delamination and cracking, a femtosecond laser is preferred. However, depending on the device structure, an ultraviolet (UV), picosecond, or nanosecond laser source can also be applied. The laser has a pulse repetition frequency in the range of 80 kHz to 1 MHz, ideally in the range of 100 kHz to 500 kHz.

The laser scribing process is performed generally to remove the material of the streets present between the integrated circuits. In accordance with an embodiment of the present invention, patterning the thin water soluble dry film 212 with the laser scribing process includes forming trenches 226 partially into the regions of the semiconductor wafer between the integrated circuits. In an embodiment, patterning the mask with the laser scribing process includes direct writing a pattern using a laser having a pulse width in the femtosecond range. Specifically, a laser with a wavelength in the visible spectrum (e.g., green band, or 500-540 nm) or the ultra-violet (UV, or 300-400 nm band) or infra-red (IR) band (the three totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask, the streets and, possibly, a portion of the semiconductor wafer or substrate.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed over a wafer or substrate may include the similar or same layers as the integrated circuits themselves. For example, FIG. 5 illustrates a cross-sectional view of a stack of materials that may be used in a street region of a semiconductor wafer or substrate, in accordance with an embodiment of the present invention. Referring to FIG. 5, a street region 500 includes the top portion 502 of a silicon substrate, a first silicon dioxide layer 504, a first etch stop layer 506, a first low K dielectric layer 508 (e.g., having a dielectric constant of less than the dielectric constant of 4.0 for silicon dioxide), a second etch stop layer 510, a second low K dielectric layer 512, a third etch stop layer 514, an undoped silica glass (USG) layer 516, a second silicon dioxide layer 518, and a layer of photo-resist 520 or some other mask. Copper metallization 522 is disposed between the first and third etch stop layers 506 and 514 and through the second etch stop layer 510. In a specific embodiment, the first, second and third etch stop layers 506, 510 and 514 are composed of silicon nitride, while low K dielectric layers 508 and 512 are composed of a carbon-doped silicon oxide material.

Under conventional laser irradiation (such as nanosecond-based or picosecond-based laser irradiation), the materials of street 500 may behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. In an embodiment, however, a femtosecond-based laser process is used to pattern a layer of silicon dioxide, a layer of low K material, and a layer of copper by ablating the layer of silicon dioxide prior to ablating the layer of low K material and the layer of copper. In a specific embodiment, pulses of approximately less than or equal to 400 femtoseconds are used in a femtosecond-based laser irradiation process to remove a mask, a street, and a portion of a silicon substrate. In another embodiment, pulses of approximately less than or equal to 500 femtoseconds are used.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The special beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 µJ to 100 µJ, although preferably approximately in the range of 10 to 5 µJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength close to (e.g., 500-540 nm), or in the UV range (e.g., 300-400 nm) provides a cleaner ablation process than a femtosecond-based laser process having a wavelength close to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Figure 2G:
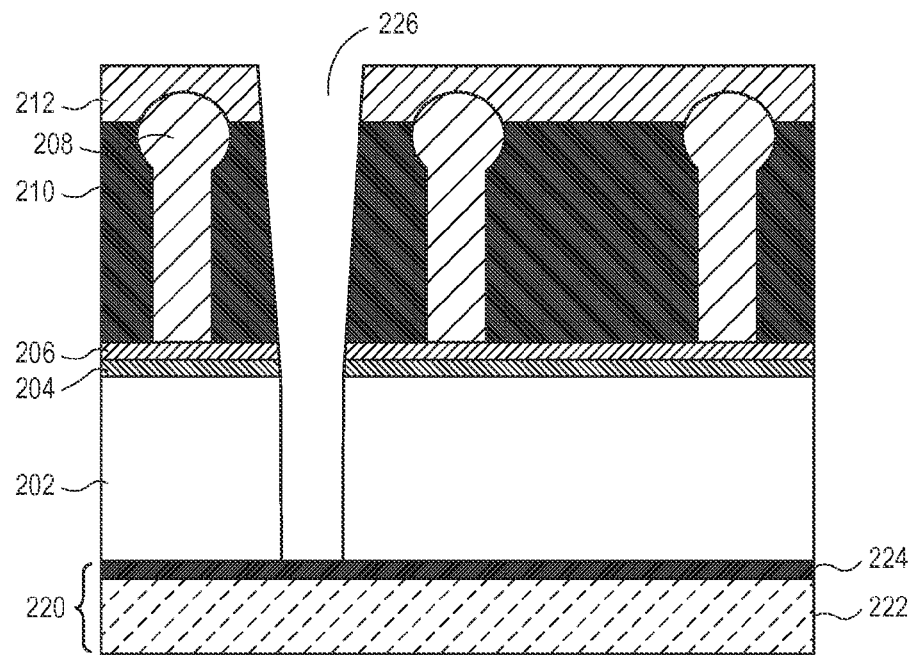

Returning to FIGS. 1A and 1B and to corresponding FIG. 2G, in some embodiments, singulation of the dies is done by plasma etching after the initial laser scribing operation. For example, the method 100A includes etching the semiconductor wafer through gaps in the patterned thin water soluble dry film to ultimately etch entirely through semiconductor wafer, at operation 112. Similarly, the method 100B includes etching the substrate 202 to advance the trench through the substrate 202 at operation 160. In the exemplary embodiments illustrated by FIG. 2G, the plasma etching is stopped on the dicing tape 220, with individualized portions of the semiconductor wafer or substrate 202 separated by trench 226.

In a specific embodiment, during the etch process the etch rate of the material of semiconductor wafer or substrate 202 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than is possible with capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. Multi-RF source configurations also results in an exceptionally wide process window. However, any plasma etch chamber capable of etching silicon may be used, at least in theory, for example, if throughput is not of paramount importance.

In an exemplary embodiment, a deep silicon etch is used to etch a single crystalline silicon substrate or wafer 202 at an etch rate greater than approximately 40% of conventional silicon etch rates (e.g., 40 µm, or more) while maintaining essentially precise profile control and virtually scallop-free sidewalls. In a specific embodiment, a through-silicon via type etch process is used. The etch process is based on a plasma generated from a reactive gas, which generally is a fluorine-based gas such as $NF_3$, $SF_6$, $SiF_4$, $C_4F_8$, $CHF_3$, $XeF_2$, or any other reactant gas capable of etching silicon at a relatively fast etch rate.

In another embodiment, the laser scribing process singulates the dies, and a plasma etching operation may be performed to remove damaged semiconductor material resulting from the laser scribing process. For example, a plasma etch operation may remove a portion of semiconductor from the sidewalls of the scribed trenches. According to embodiments, the singulated dies need sufficiently high die break strengths to ensure reliable die pick and place and subsequent assembly processes. It has been found that the rough, damaged sidewalls present following the laser ablation operation may unacceptably reduce die break strength. However, it has also been found that the damage layer in a silicon substrate for a femtosecond laser is less than 3 µm thick and that a higher die break strength can be achieved by performing the plasma etch operation 106 to remove a comparable thickness of semiconductor from sidewalls exposed by the trench 226.

Vertical etch rates of 10 µm/min are expected with lateral etch rate being between 50 and 100% of that, depending on process conditions. As such, etch time is generally within 10 to 90 sec, depending on the desired undercut and/or remaining thickness of the substrate.

Figure 2H:
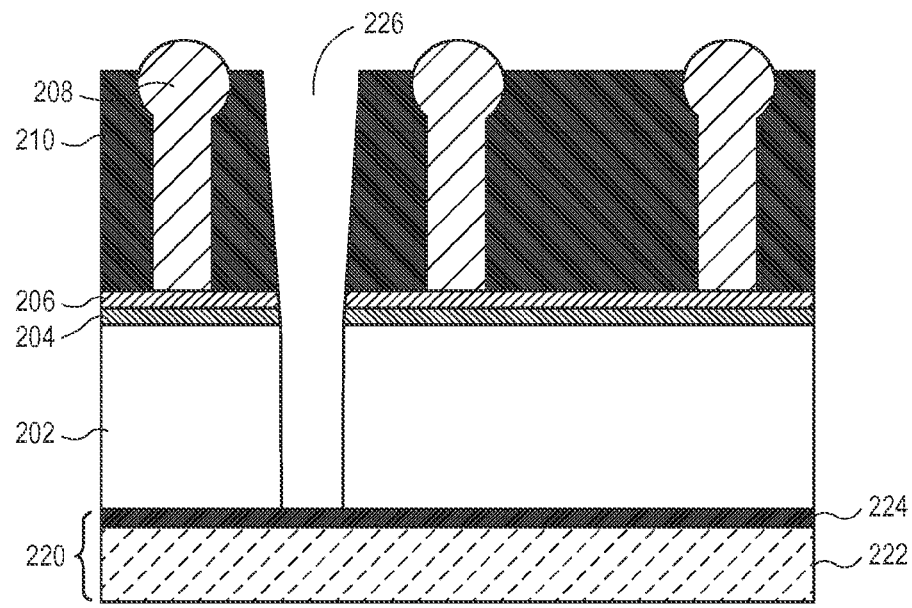

After plasma etching at operations 112 of FIG. 1A and 160 of FIG. 1B, the methods involve removing the thin water soluble dry film 212 at operations 114 (of FIG. 1A) and operation 162 (of FIG. 1B), as illustrated in FIG. 2H. Removing the thin water soluble dry film 212 may involve pressurized water jets, a water bath, or other water soluble film removal methods.

Thus, FIGS. 1A and 1B depict methods of dicing a semiconductor wafer or substrate involving application of a thin water soluble film via dry lamination techniques. In some embodiments, the use of an adhesive tape enables application of very thin water soluble films without breaking the thin water soluble films.

Figure 3:
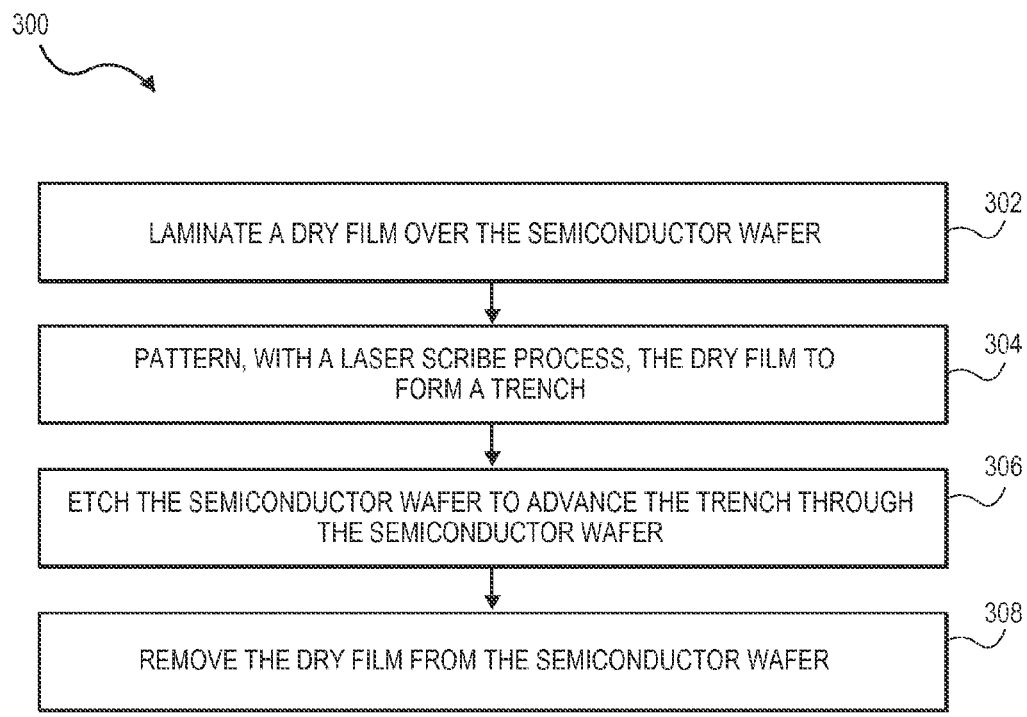
FIG. 3 is a flowchart representing operations in a method of dicing a semiconductor wafer including a plurality of integrated circuits, in accordance with an embodiment of the present invention.

FIG. 3 is a flowchart representing operations in another method of dicing a semiconductor wafer including a plurality of integrated circuits, in accordance with an embodiment of the present invention. FIGS. 4A, 4B, 4C, 4D, and 4E illustrate cross-sectional views of a semiconductor wafer including a plurality of integrated circuits during performance of a method of dicing the semiconductor wafer, corresponding to operations of FIG. 3, in accordance with embodiments of the present invention. The method 300 of FIG. 3 involves dry lamination of a film that is thick enough to withstand heating and stretching without breaking. For example, in one embodiment, the method 300 applies to dry films having a thickness of greater than or equal to 15 μm.

Figure 4A:
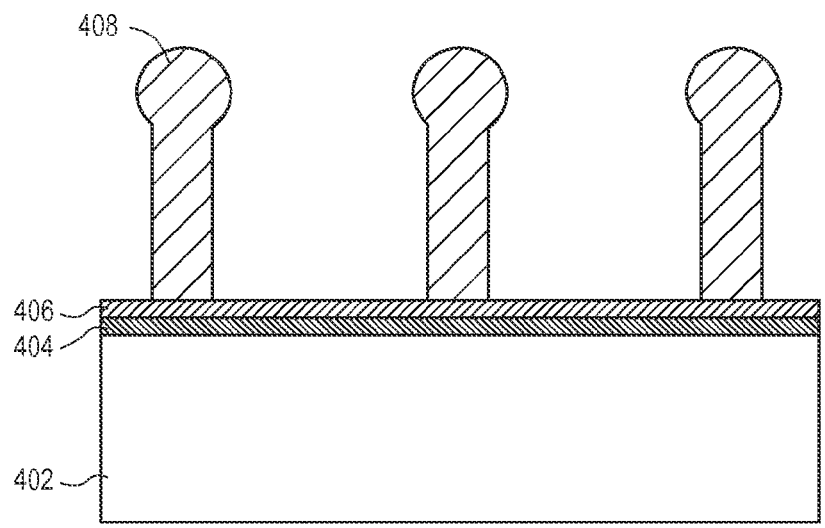
FIGS. 4A, 4B, 4C, 4D, and 4E illustrate cross-sectional views of a semiconductor wafer including a plurality of integrated circuits during performance of a method of dicing the semiconductor wafer, corresponding to operations of FIG. 3, in accordance with embodiments of the present invention.
Figure 4B:
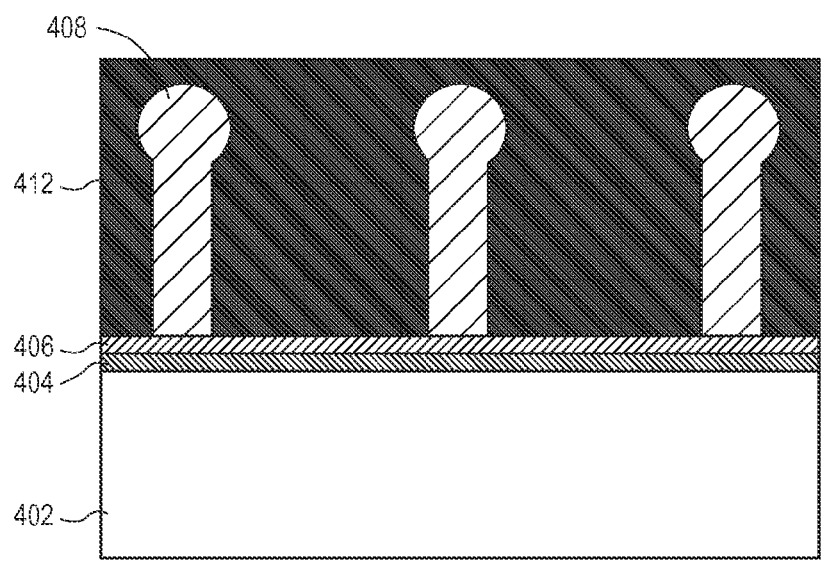
Figure 4C:
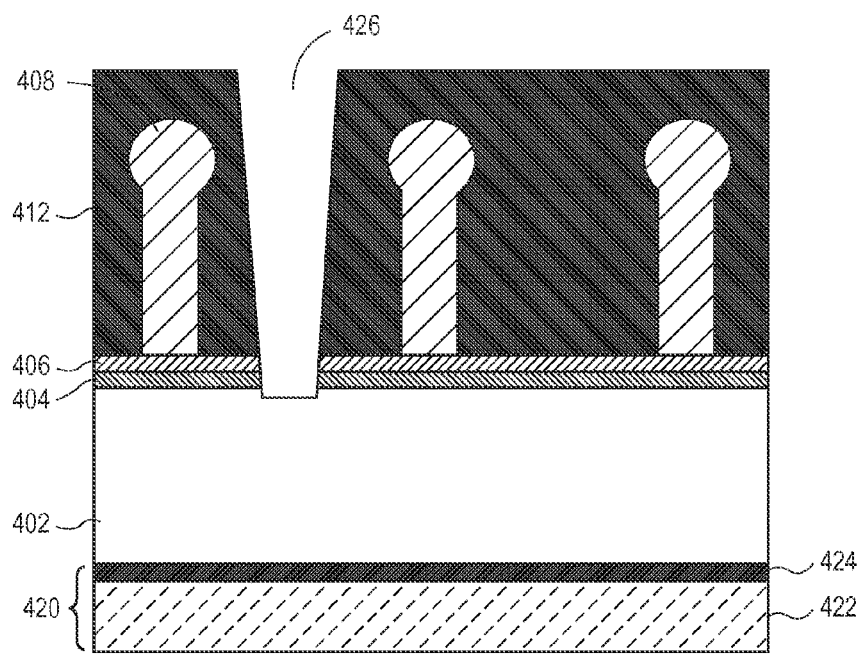
Figure 4D:
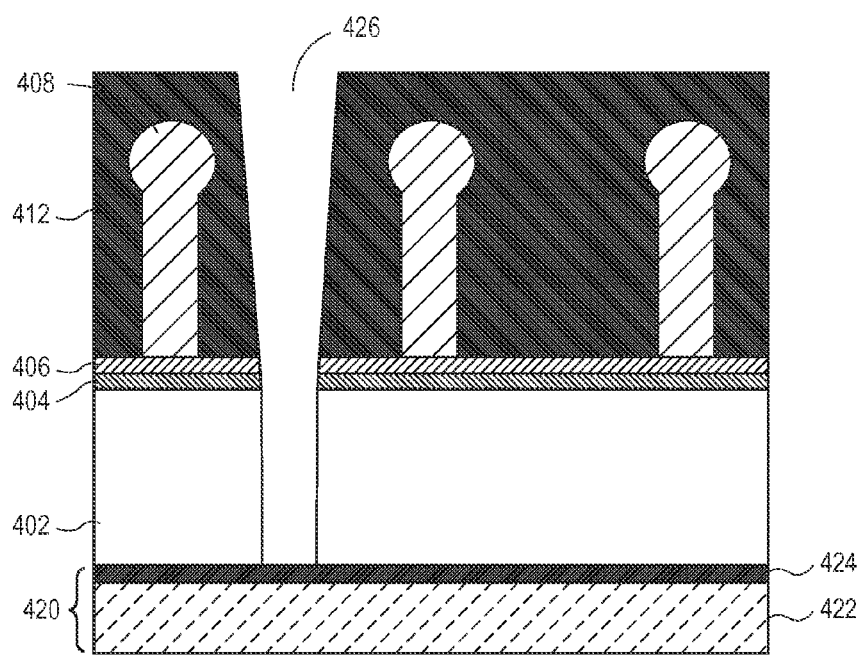
Figure 4E:
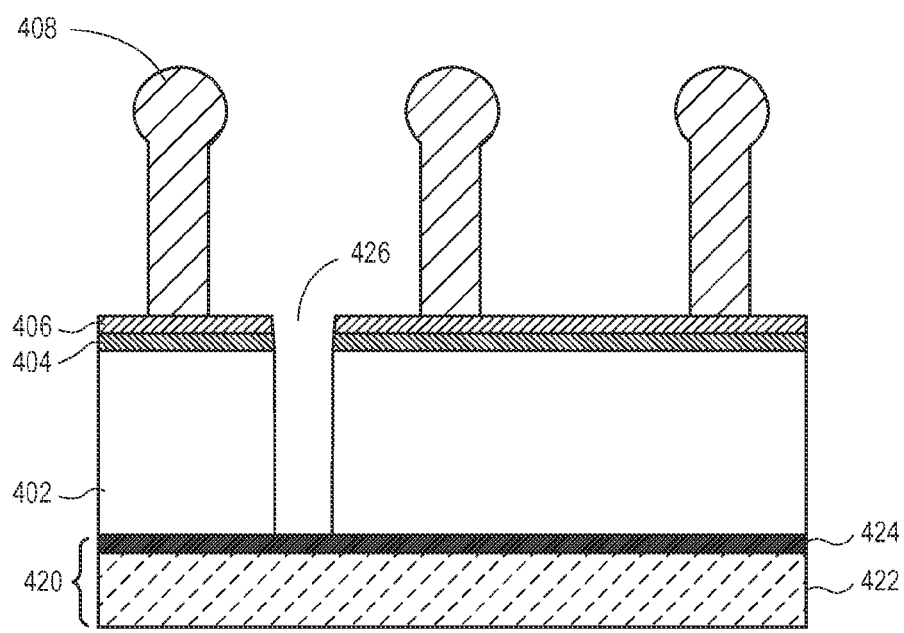

The method 300 of FIG. 3 begins with a semiconductor wafer with a plurality of integrated circuits (ICs). FIG. 4A illustrates a cross-sectional view of an exemplary semiconductor wafer. The substrate 402, device layer 404, passivation layer 406, and conductive bumps or pads 408 may be similar to, or the same as, the corresponding features of FIG. 2A. At operation 302 and corresponding to FIG. 4B, the method 300 involves laminating a dry film 412 over the semiconductor wafer or substrate 402. Laminating the dry film over the semiconductor wafer or substrate 402 may involve heating the dry film, stretching the heated dry film, and attaching the stretched dry film to the semiconductor wafer. The method may also involve attaching the semiconductor wafer or substrate 402 to dicing tape 420, which may include a base material layer 422 and a release layer 424.

After dry lamination of the dry film 412, the method involves dicing the semiconductor wafer or substrate 402 via a laser scribe process and plasma etching. At operation 304, the method involves patterning, with a laser scribe process, the dry film to form a trench 426 exposing regions of the semiconductor wafer between the ICs, as illustrated in FIG. 2C. At operation 306, the method 300 involves etching the semiconductor wafer to advance the trench through the semiconductor wafer, as illustrated in FIG. 2D. As described above, other embodiments may involve singulating the dies with the laser scribing process, followed by plasma etching to remove damaged semiconductor from the laser scribing process.

At operation 308, the method also involves removing the dry film from the semiconductor wafer. According to one embodiment, the method involves forming an underfill layer over the diced ICs after the etching operation and after removal of the dry film 412. Thus, in contrast to existing methods involving spin-coating techniques to apply water soluble masks, the method 300 in FIG. 3 involves applying a water soluble dry film with a dry lamination process. Applying the water soluble dry film with a dry lamination process can reduce voids or air bubbles in the mask that occur during spin-coating.

Figure 6:
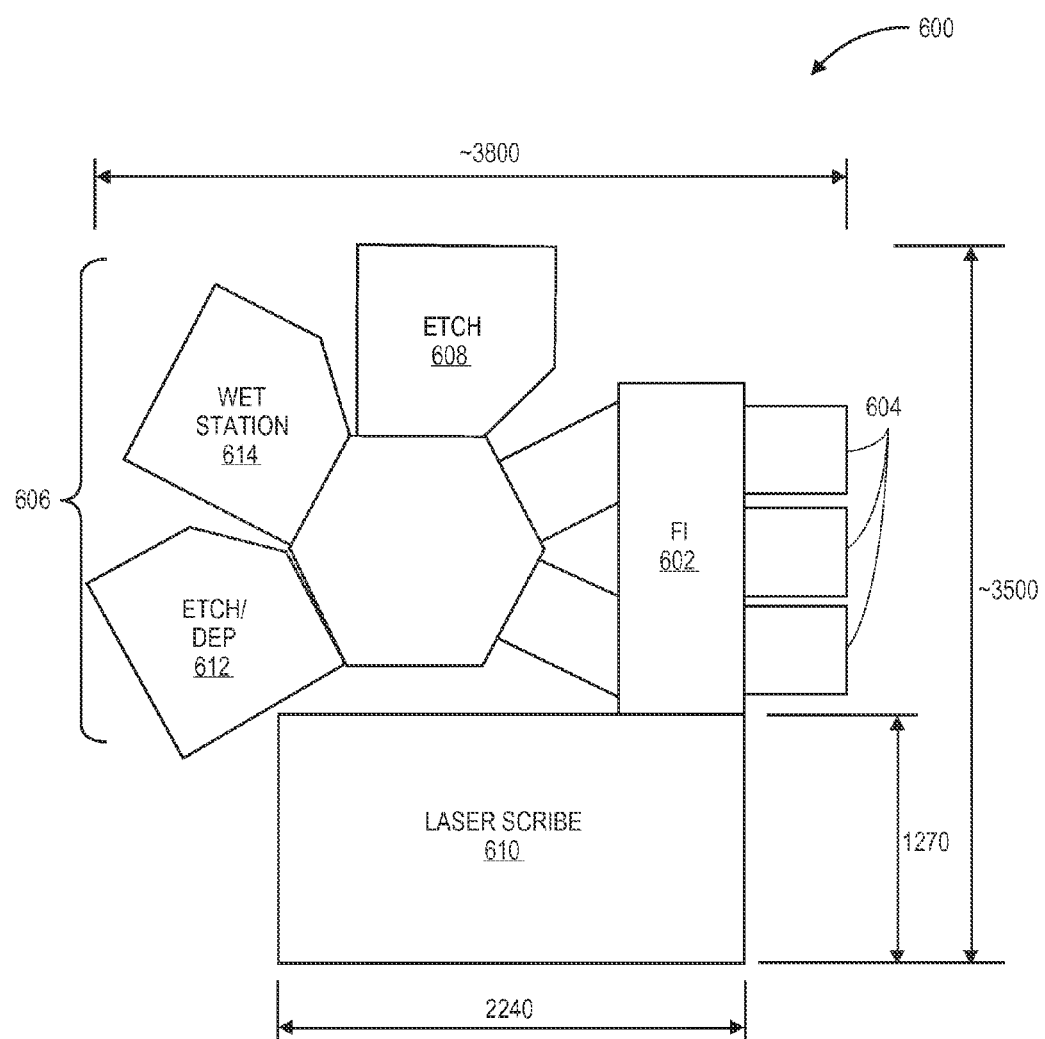
FIG. 6 illustrates a block diagram of a tool layout for laser and plasma dicing of substrates, in accordance with an embodiment of the present invention.

Turning to FIG. 6, a single integrated platform 600 may be configured to perform many or all of the operations in the hybrid laser ablation-plasma etch singulation processes 100A, 100B, and 300. For example, FIG. 6 illustrates a block diagram of a cluster tool 606 coupled with laser scribe apparatus 610 for laser and plasma dicing of substrates, in accordance with an embodiment of the present invention. Referring to FIG. 6, the cluster tool 606 is coupled to a factory interface 602 (FI) having a plurality of load locks 604. The factory interface 602 may be a suitable atmospheric port to interface between an outside manufacturing facility with laser scribe apparatus 610 and cluster tool 606. The factory interface 602 may include robots with arms or blades for transferring substrates (or carriers thereof) from storage units (such as front opening unified pods) into either cluster tool 606 or laser scribe apparatus 610, or both.

A laser scribe apparatus 610 is also coupled to the FI 602. In an embodiment, the laser scribe apparatus 610 includes a femtosecond laser operating in the 300-540 nm band. The femtosecond laser to performing the laser ablation portion of the hybrid laser and etch singulation processes 100A of FIG. 1A, 100B of FIG. 1B, and 300 of FIG. 3. In one embodiment, a moveable stage is also included in laser scribe apparatus 610, the moveable stage configured for moving a wafer or substrate (or a carrier thereof) relative to the femtosecond-based laser. In a specific embodiment, the femtosecond laser is also moveable.

The cluster tool 606 includes one or more plasma etch chambers 608 coupled to the FI by a robotic transfer chamber housing a robotic arm for in-vaccuo transfer of substrates. The plasma etch chambers 608 is suitable for performing a plasma etch portion of the hybrid laser and etch singulation process 100. In one exemplary embodiment, the plasma etch chamber 608 is further coupled to an $SF_6$ gas source and at least one of a $C_4F_8$ and $C_4F_6$ source. In one embodiment, the plasma etch chamber 608 is coupled to an $SF_6$ gas source and at least one of a $C_4F_8$, $CF_4$, and $C_4F_6$ source. In a specific embodiment, the one or more plasma etch chambers 608 is an Applied Centura® Silvia™ Etch system, available from Applied Materials of Sunnyvale, Calif., USA, although other suitable etch systems are also available commercially. In an embodiment, more than one etch chamber 608 is included in the cluster tool 606 portion of integrated platform 600 to enable high manufacturing throughput of the singulation or dicing process.

Other chambers or stations suitable for performing functions described herein may be a part of the cluster tool 606, or separate from the cluster tool 606. For example, a tape applicator may be configured to adhere an adhesive tape to a thin dry film. A dry lamination module and a wet station 614 may also be included. According to one embodiment, the dry lamination module is separate from the cluster tool 606. A dry lamination module may include a heater configured to heat a film (e.g., a thin water soluble dry film adhered to an adhesive tape), and a stretching mechanism configured to stretch the heated film. The dry lamination module may further include an applicator configured to attach the stretched dry film to the semiconductor wafer or substrate. The dry lamination module may be configured to laminate the dry film (e.g., while adhered to the adhesive tape) to a semiconductor wafer or substrate. The dry lamination module may also be configured to form an underfill layer over the semiconductor wafer or substrate. Thus, in one such embodiment, dicing tool costs may be reduced by applying both the wafer-level underfill and the dry film mask layer with the same tool.

A curing module may be included to release the adhesive tape from the thin dry film, for example, with UV radiation sources or heaters. The wet station 614 may be configured to dissolve the water soluble dry film after plasma etching the substrate. The wet station 614 may include for example a pressurized spray jet to dispense water other solvent. Although the wet station 614 is illustrated as integrated in the cluster tool 606, other embodiments may include a wet station that is physically separate from the cluster tool 606. A deposition chamber or an additional etch chamber 612 may also be included. A deposition chamber may be configured to deposit a post-dicing underfill layer (e.g., with a spin coating module), as described above with respect to the method 300 of FIG. 3. The cluster tool may also include a controller (not shown in FIG. 6) to configure and/or control the modules to perform methods described herein. The controller may include, for example, elements of the computer system 700 of FIG. 7.

Figure 7:
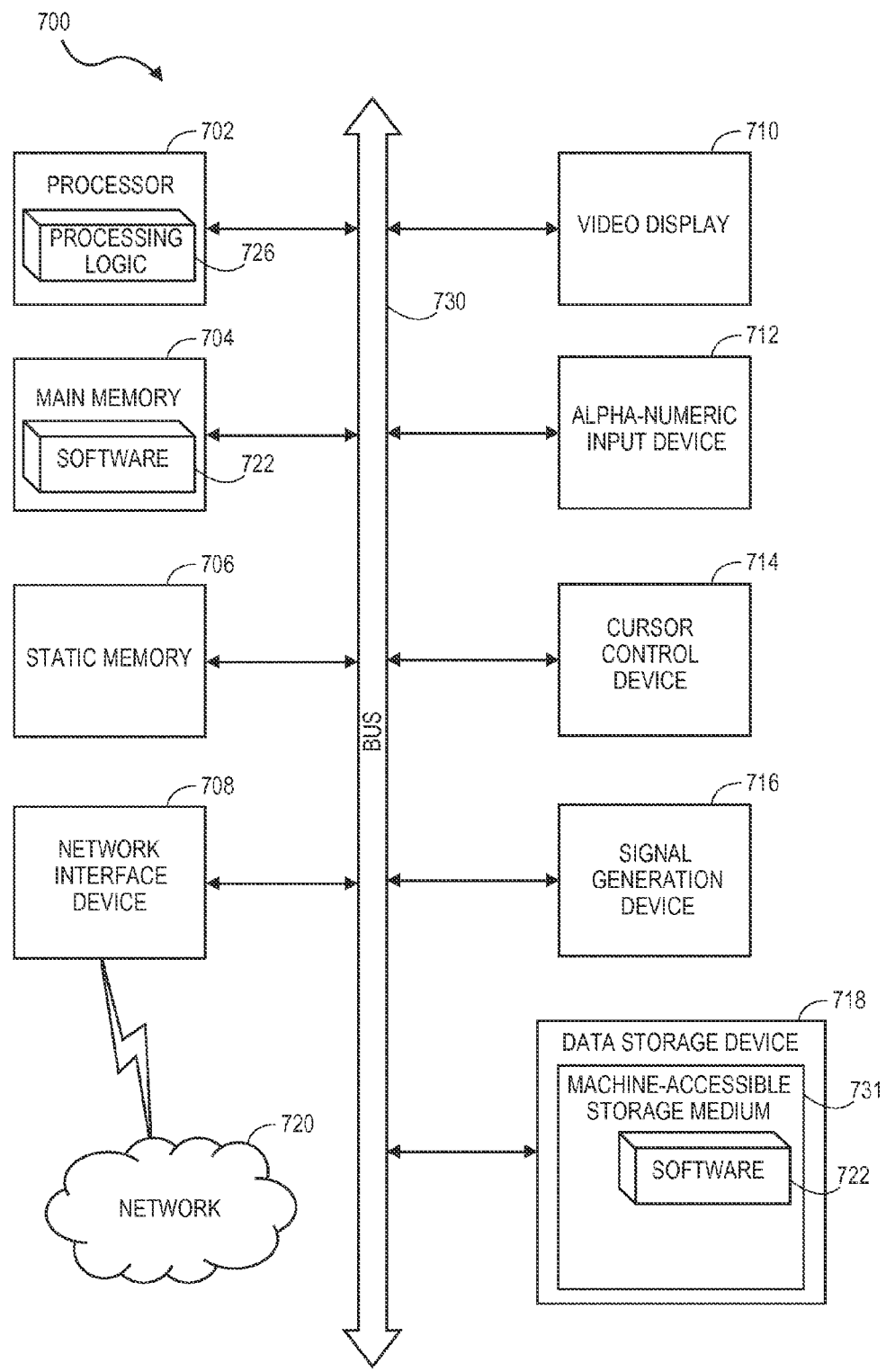
FIG. 7 illustrates a block diagram of an exemplary computer system which controls automated performance of one or more operations in the masking, laser scribing, plasma dicing methods described herein, in accordance with an embodiment of the present invention.

FIG. 7 illustrates a computer system 700 within which a set of instructions, for causing the machine to execute one or more of the scribing methods discussed herein may be executed. The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, etc. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations and steps discussed herein.

The computer system 700 may further include a network interface device 708. The computer system 700 also may include a video display unit 710 (e.g., a liquid crystal display (LCD) or a cathode ray tube (CRT)), an alpha-numeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 731 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media, and other non-transitory machine-readable storage medium.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A system for dicing a substrate comprising a plurality of integrated circuits (ICs), the system comprising:
   a tape applicator configured to adhere an adhesive tape to a thin dry film;
   a dry lamination module configured to laminate the thin dry film adhered to the adhesive tape over the substrate;
   a curing module to release the adhesive tape from the thin dry film;
   a laser scribe module configured to pattern, with a laser scribe process, the thin dry film to form a trench exposing regions of the substrate between the ICs; and
   a plasma etch module physically coupled to the laser scribe module and configured to etch the substrate to advance the trench through the substrate.

2. The system of claim 1, wherein the dry lamination module comprises:
   a heater configured to heat the thin dry film adhered to the adhesive tape;
   a stretching mechanism configured to stretch the heated thin dry film adhered to the adhesive tape; and
   an applicator configured to attach the stretched thin dry film to the substrate.

3. The system of claim 1 wherein:
   the tape applicator is further configured to adhere a release layer of the adhesive tape to a first layer of the thin dry film;
   the dry lamination module is further configured to attach a second side of the thin dry film to the substrate; and
   the curing module is further configured to remove the adhesive tape by releasing the release layer.

4. The system of claim 3, wherein the curing module comprises an ultra-violet (UV) light source configured to irradiate the adhesive tape, releasing the adhesive tape from the thin dry film.

5. The system of claim 3, wherein the curing module comprises a heater configured to heat the adhesive tape, releasing the adhesive tape from the thin dry film.

6. The system of claim 1, further comprising:
   a robotic transfer chamber to transfer a laser scribed substrate from the laser scribe module to the plasma etch module.

* * * * *